United States Patent
Tivarus

(10) Patent No.: US 8,133,769 B1
(45) Date of Patent: Mar. 13, 2012

(54) METHODS FOR GETTERING IN SEMICONDUCTOR SUBSTRATE

(75) Inventor: Cristian A. Tivarus, Rochester, NY (US)

(73) Assignee: Truesense Imaging, Inc., Rochester, NY (US)

( * ) Notice: Subject to any disclaimer, the term of this patent is extended or adjusted under 35 U.S.C. 154(b) by 0 days.

(21) Appl. No.: 12/971,637

(22) Filed: Dec. 17, 2010

(51) Int. Cl.
*H01L 21/8232* (2006.01)

(52) U.S. Cl. ........ 438/143; 438/310; 438/402; 438/471; 438/E21.549

(58) Field of Classification Search ............... 438/143, 438/424, 292–293, 310, 402, 58, 471; 437/292–293
See application file for complete search history.

(56) References Cited

U.S. PATENT DOCUMENTS

| 4,534,824 | A | * | 8/1985 | Chen | 438/421 |
| H204 | H | * | 2/1987 | Oh et al. | 438/433 |
| 5,453,385 | A | | 9/1995 | Shinji | |
| 6,509,249 | B1 | | 1/2003 | Gonzalez | |
| 7,470,944 | B2 | | 12/2008 | Ishida et al. | |

* cited by examiner

*Primary Examiner* — Dung A. Le
(74) *Attorney, Agent, or Firm* — Bingham McCutchen LLP

(57) ABSTRACT

A method for forming gettering sites and gettering impurities in a substrate layer includes producing a first masking layer over the substrate layer and patterning the masking layer to define openings at locations where trenches will be formed in the substrate layer at a later time. Ions are then implanted into the substrate layer to produce gettering sites. The gettering sites are disposed at a depth in the substrate layer such that the sites are removed when the trenches are formed. The first masking layer is removed and impurities driven to the gettering sites by thermally processing the substrate layer. A second masking layer is then produced over the substrate layer and patterned to define openings at locations where the trenches will be formed. The substrate layer is etched to produce the trenches. The gettering sites and gettered impurities are removed when the trenches are etched into the substrate layer.

18 Claims, 9 Drawing Sheets

METHODS FOR GETTERING IN SEMICONDUCTOR SUBSTRATE

TECHNICAL FIELD

The present invention relates generally to semiconductor substrate or wafer processing, and more particularly to methods of forming gettering sites and gettering impurities in semiconductor substrates or wafers.

BACKGROUND

Gettering is a technique used during semiconductor device fabrication process to remove impurities from the active device areas. The impurities include metallic impurities such as, for example, iron, gold, nickel and copper. These metallic impurities create deep level traps inside the semiconductor band gap that act as generation-recombination sites. It is well known that these sites result in the degradation of semiconductor device performance. In particular, they result in increased dark current and defective pixels in image sensor devices.

Gettering methods are commonly used in semiconductor device processing to remove unwanted metallic impurities. These metallic impurities are incorporated in the semiconductor lattice during production of semiconductor substrates or wafers such as Czochralski ingot pulling or epitaxial growth. A variety of gettering techniques are known and used.

One set of methods involve creating a gettering site at or near the backside of the semiconductor substrates where circuit devices are not planned to be formed. These methods include intentionally creating damage through ion implantation or deposition of metal films that act as a sink for metallic impurities. These methods do not work for slow diffusing impurities or require very long processing times and high thermal budgets since the metal impurities have to travel through the entire wafer thickness to get to the gettering sites. Moreover, these methods are not effective for silicon on insulator (SOI) type wafers where the buried oxide layer acts as a diffusion barrier.

Another set of gettering methods use "proximity gettering" and involve creating gettering sites close to the region where devices are located. These methods overcome some of the problems listed above for the methods that use backside damage. Such methods are described in U.S. Pat. No. 6,509,248, U.S. Pat. No. 7,470,944, and U.S. Pat. No. 5,453,385.

The method proposed in U.S. Pat. No. 5,453,385 uses oxide growth to remove the gettering sites formed below LOCOS structures. This has the disadvantage that some impurities cannot be incorporated in the oxide but instead remain inside the silicon as the oxide is grown. Also, LOCOS isolation has become obsolete in a number of semiconductor processes and has been replaced by other isolation techniques such as trench isolation.

U.S. Pat. No. 6,509,248 discloses the use of ion implantation through previously etched trench isolation structures to form gettering sites relatively deep inside the semiconductor substrates. However, since the gettering sites are not removed from the wafer, some of the metal impurities become un-gettered during the high temperature steps used for device fabrication. Also, metal impurities located at the gettering sites generate charged carriers that can reach the active area of devices. To prevent these charges from reaching the devices, U.S. Pat. No. 7,470,944 proposes contacting the gettering site so that a transport path for the charge is formed. This however requires complicated processing with addition of multiples extra steps. Also, control of the gettering site size has to be very precise so that it doesn't extend to the device active area.

SUMMARY

A method for forming gettering sites and gettering impurities in a substrate layer includes producing a first masking layer over the substrate layer and patterning the masking layer to define openings at locations where trenches will be formed in the substrate layer at a later time. The trenches are used to produce trench isolation regions in an embodiment in accordance with the invention. Ions are then implanted into the substrate layer to produce gettering sites in the substrate layer. The gettering sites are disposed at a depth in the substrate layer that the gettering sites are removed when the trenches are formed. The first masking layer is removed and the impurities driven to the gettering sites by thermally processing (heating) the substrate layer. A second masking layer is then produced over the substrate layer and patterned to define openings at locations where the trenches will be formed. The substrate layer is etched to produce the trenches. The gettering sites and gettered impurities are removed when the trenches are produced into the substrate layer.

BRIEF DESCRIPTION OF THE DRAWINGS

Embodiments of the invention are better understood with reference to the following drawings. The elements of the drawings are not necessarily to scale relative to each other.

DETAILED DESCRIPTION

Figure 1:
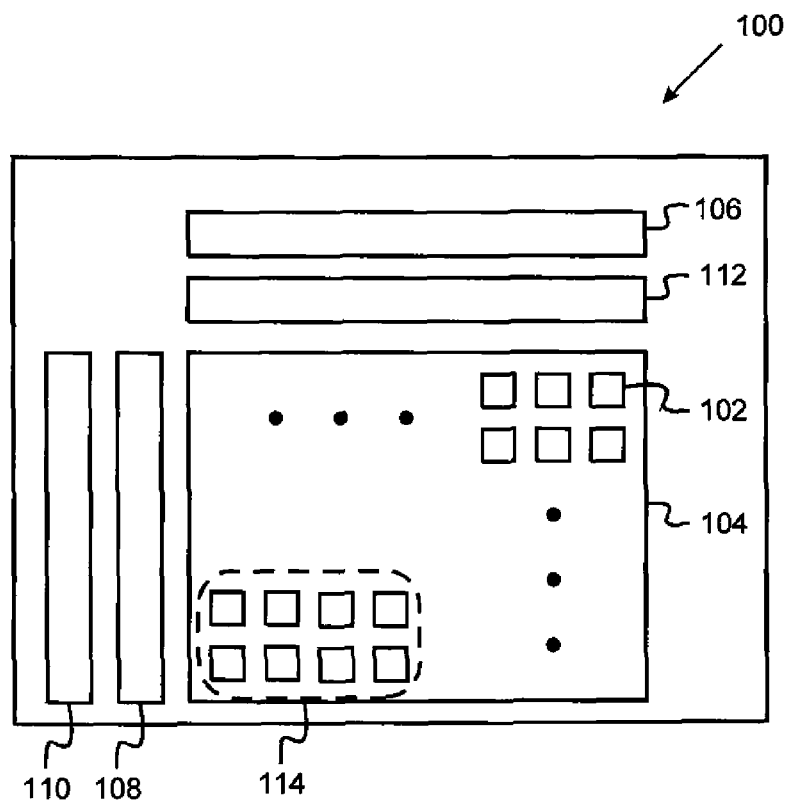
FIG. 1 is a simplified block diagram of a top view of an image sensor in an embodiment in accordance with the invention.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected, or an indirect connection through one or more passive or active intermediary devices. The term "circuit" means either a single component or a multiplicity of components, either active or passive, that are connected together to provide a desired function. The term "signal" means at least one current, voltage, or data signal.

Additionally, directional terms such as "on", "over", "top", "bottom", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

And finally, the term "substrate layer" is to be understood as a semiconductor-based wafer or die material including, but not limited to, silicon, silicon-on-insulator (SOI) technology, silicon-on-sapphire (SOS) technology, doped and undoped semiconductors, epitaxial layers or well regions formed on a semiconductor substrate, and other semiconductor structures.

The present invention is described herein in conjunction with an image sensor. Image sensors are included in image capture devices, such as still and video cameras, scanners, copiers, and cell phones. Embodiments in accordance with the invention, however, are not limited to use with image sensors. The present invention can be used to form gettering sites and getter impurities in any device that includes a semiconductor substrate or wafer having trench regions.

Referring to the drawings, like numbers indicate like parts throughout the views.

FIG. 1 is a simplified block diagram of a top view of an image sensor in an embodiment in accordance with the invention. Image sensor 100 is implemented as any type of image sensor that is formed in a substrate layer in an embodiment in accordance with the invention. Charge couple device (CCD) and complementary metal oxide semiconductor (CMOS) image sensors are examples of image sensors formed in a substrate layer.

Image sensor 100 includes a number of pixels 102 that are typically arranged in rows and columns to form a pixel array 104. Image sensor 100 further includes column decoder 106, row decoder 108, digital logic 110, and readout output circuits 112. Row decoder 108 provides control signals to the rows of pixels 102 in pixel array 104. Some of these control signals are used to read out the signals from individual rows of pixels. Other control signals are used to reset individual rows of pixels to a known potential.

Each column of pixels in pixel array 104 is electrically connected to a readout output circuit 112. Readout output circuits 112 sample and hold the signals output from the columns of pixels. Column decoder 106 addresses readout output circuits 112 to read out the sampled signals.

Figure 2:
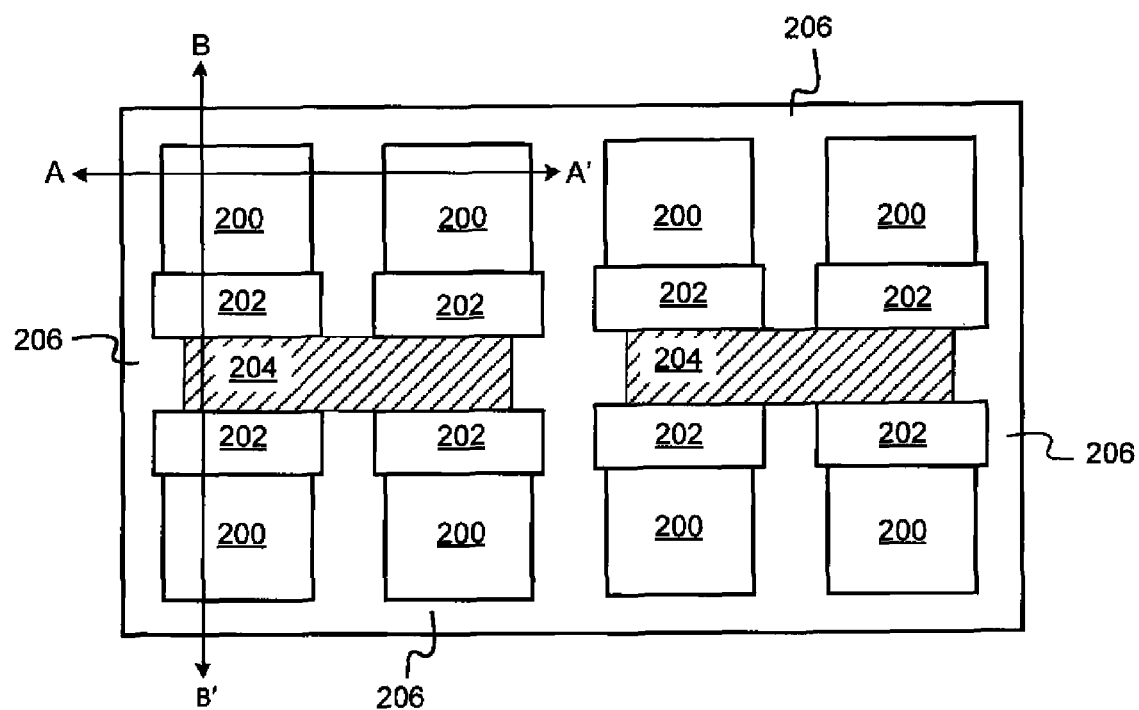
FIG. 2 is a top view of region 114 shown in FIG. 1 in an embodiment in accordance with the invention.

Referring now to FIG. 2, there is shown a simplified top view of region 114 shown in FIG. 1 in an embodiment in accordance with the invention. Region 114 includes eight photodetectors 200 and eight transfer gates 202. The photodetectors and transfer gates are grouped into two groups such that four photodetectors 200 share a common charge-to-voltage conversion region 204. Photodetectors 200 accumulate and store charge carriers in response to incident light. The accumulated charge carriers are transferred to a respective common charge-to-voltage conversion region 204 when an appropriate signal is applied to a respective transfer gate 202.

Trench isolation regions (not shown) are formed in substrate layer 206 around the photodetectors 200, transfer gates 202, and charge-to-voltage conversion regions 204.

Figure 3:
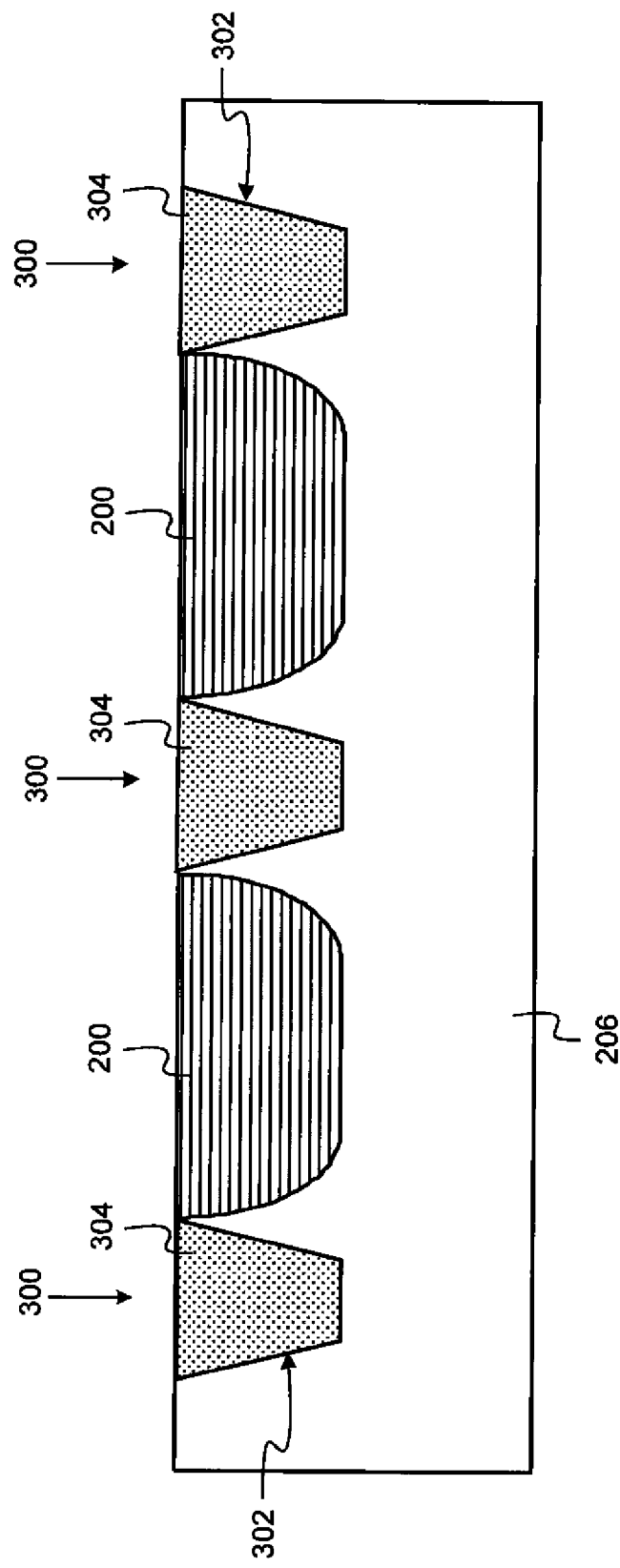
FIG. 3 is a cross-sectional view along line A-A' shown in FIG. 2.

FIG. 3 is a cross-sectional view along line A-A' shown in FIG. 2. Trench isolation regions 300 are formed in substrate layer 206 and electrically isolate a photodetector 200 from adjacent photodetectors 200. Trench isolation regions 300 include trenches 302 formed in substrate layer 206 that are filled with an insulating material 304.

Figure 4:
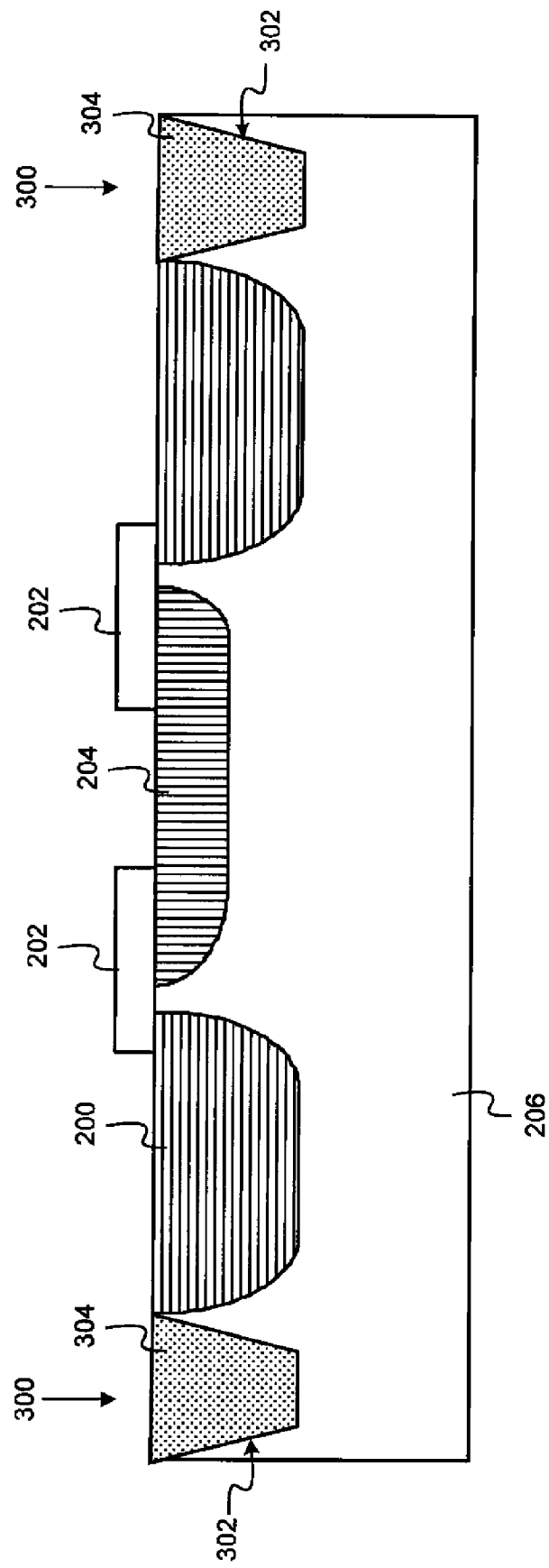
FIG. 4 is a cross-sectional view along line B-B' shown in FIG. 2.

Trench isolation regions 300 reduce or eliminate electrical crosstalk in image sensors. Electrical crosstalk occurs when charge carriers that should be stored by one photodetector diffuse or migrate to an adjacent photodetector. FIG. 4 is a cross-sectional view along line B-B' shown in FIG. 2. Trench isolation regions 300 are formed in substrate layer 206 adjacent to photodetectors 200.

Figure 5A:
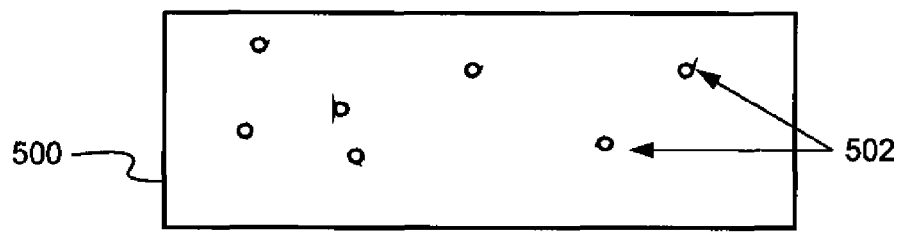
FIGS. 5A-5F are cross-sectional views of a substrate wafer that are used to illustrate a first method of forming gettering sites and gettering impurities in an embodiment in accordance with the invention.

Referring now to FIGS. 5A-5F, there is shown cross-sectional views of a substrate layer that are used to illustrate a first method of forming gettering sites and gettering impurities in an embodiment in accordance with the invention. Substrate layer 500 includes impurities 502, as shown in FIG. 5A. The impurities include metallic impurities such as, for example, iron, gold, nickel and copper.

Figure 5B:
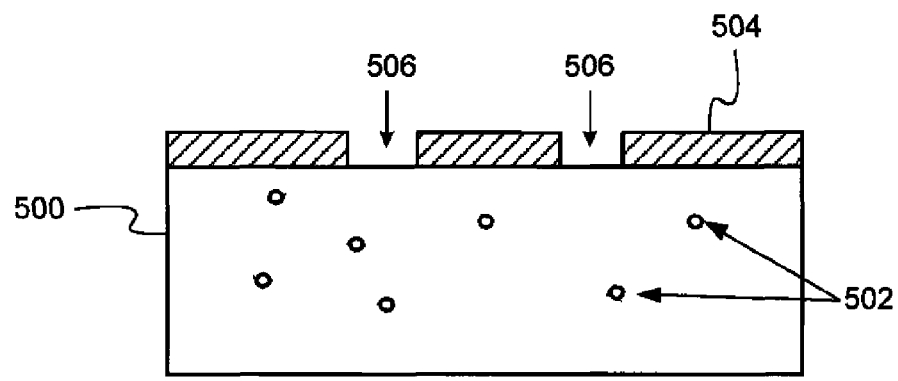

Masking layer 504 is deposited over substrate layer 500 and patterned to define openings 506 (FIG. 5B). Masking layer 504 is implemented as a photoresist in an embodiment in accordance with the invention. The areas of substrate layer 500 that are exposed in openings 506 correspond to areas where trench isolation regions will be formed at a later point in the processing of substrate layer 500.

Figure 5C:
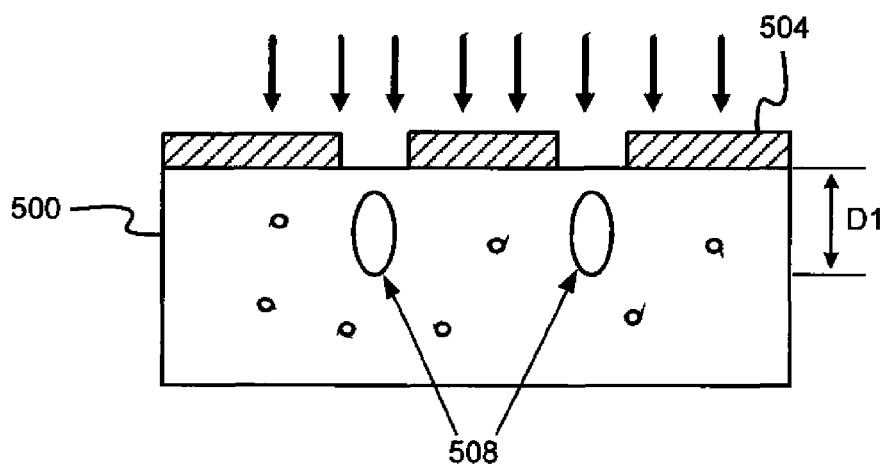

Next, as shown in FIG. 5C, ions are implanted into substrate layer 500, as represented by the arrows. The implanted ions produce gettering sites 508 in substrate layer 500. Gettering sites 508 are disposed at a depth (D1) in substrate layer 500 that will be removed during formation of the trench isolation regions in an embodiment in accordance with the invention. For example, in an image sensor, the dimensions of trench isolation regions typically are between 0.2 to 1 micron deep (D1) and 0.2 to 0.7 microns wide. The depth of the yet-to-be formed trench isolation regions determine the energy of the ion implantation so that the gettering sites are removed during formation of the trench isolation regions.

Figure 5D:
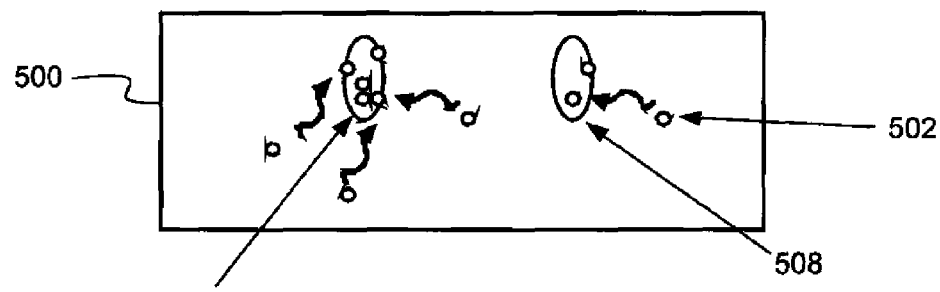

Masking layer 504 is then removed, as shown in FIG. 5D. After masking layer 504 is removed, substrate layer 500 is heated to drive metal impurities 502 to gettering sites 508. Typically, the gettering process involves heating substrate layer 500 to a high temperature to drive the metal impurities to the gettering sites.

Figure 5E:
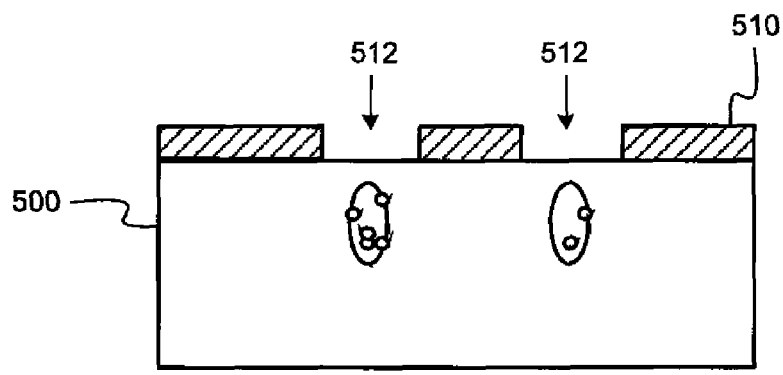

Next, as shown in FIG. 5E, masking layer 510 is deposited over substrate layer 500 and patterned to define openings 512. The areas of substrate layer 500 that are exposed in openings 512 correspond to areas where trench isolation regions will be formed at a later point in the processing of substrate layer 500. The size of openings 512 can be the same size or a larger size from openings 506 shown in FIG. 5B.

Figure 5F:
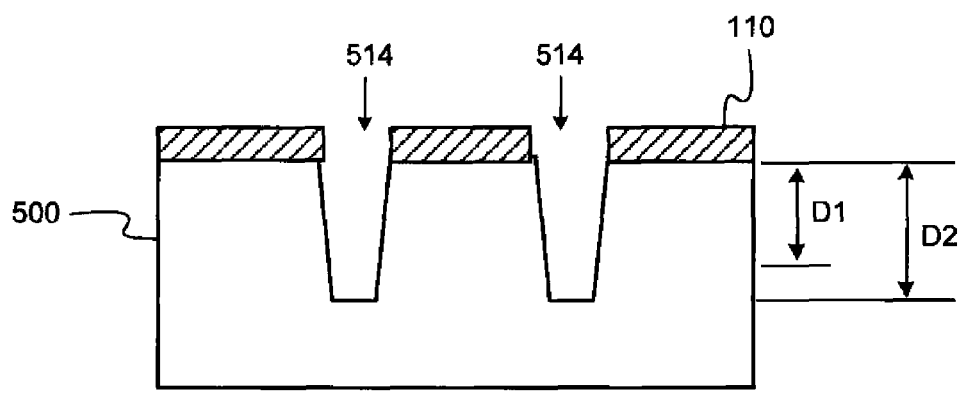

Substrate layer 500 is then etched to produce trenches 514, as shown in FIG. 5F. Trenches 514 are etched to a depth D2 in substrate layer 500. Since gettering sites 508 were disposed at a shallower depth D1 compared to depth D2, gettering sites 508 and the gettered impurities at or around the gettering sites 508 are removed during the etching process. Masking layer 510 is later removed and trenches 514 filled with an insulating material (not shown) to produce trench isolation regions.

Figure 6A:
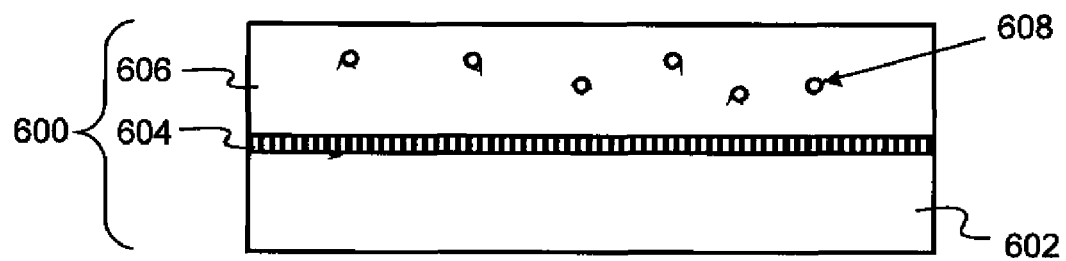
FIGS. 6A-6F are cross-sectional views of a substrate layer that are used to depict a second method of forming gettering sites and gettering impurities in an embodiment in accordance with the invention.
Figure 6B:
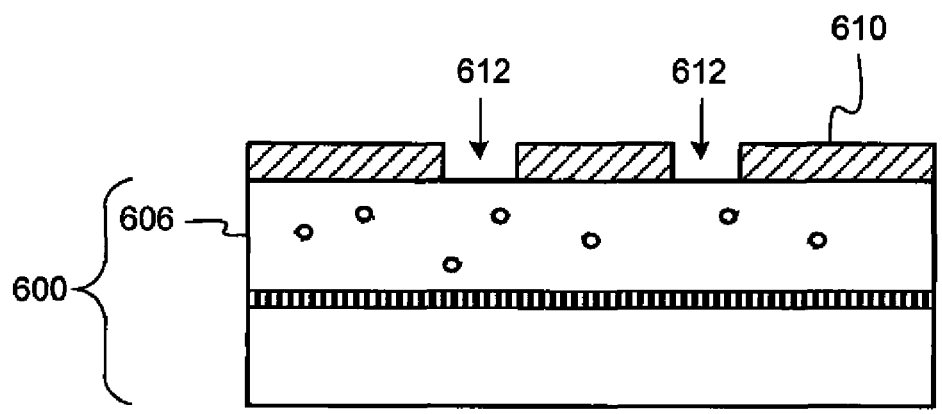

FIGS. 6A-6F are cross-sectional views of a substrate layer that are used to depict a second method of forming gettering sites and gettering impurities in an embodiment in accordance with the invention. Substrate layer 600 includes a semiconductor substrate 602, an insulating layer 604 such as a buried oxide layer, and a silicon epitaxial layer 606. Substrate layer 600 is known in the art as a "silicon-on-insulator" or SOI wafer. Epitaxial layer 606 includes impurities 608, as shown in FIG. 6A. The impurities include metallic impurities such as, for example, iron, gold, nickel and copper. Masking layer 610 is deposited over substrate layer 600 and patterned to define openings 612 (FIG. 6B). Masking layer 610 is implemented as a photoresist in an embodiment in accordance with the invention. The areas of epitaxial layer 606 that are exposed in openings 612 correspond to areas where trench isolation regions will be formed at a later point in the processing of substrate layer 600.

Figure 6C:
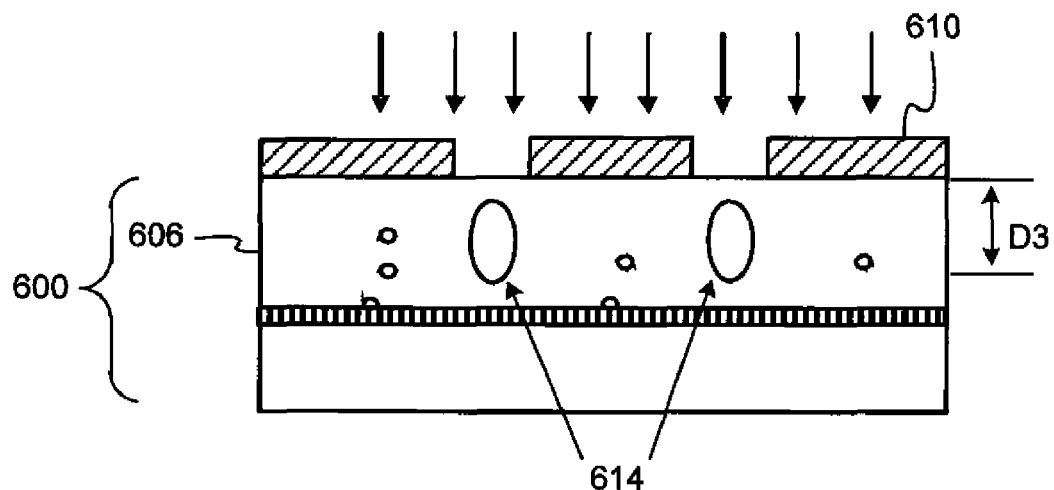

Next, as shown in FIG. 6C, ions are implanted into epitaxial layer 606, as represented by the arrows. The implanted ions produce gettering sites 614 in epitaxial layer 608. Gettering sites 614 are disposed at a depth (D3) in substrate layer 600 (i.e., epitaxial layer 606) that will be removed during formation of the yet-to-be-formed trench isolation regions in an embodiment in accordance with the invention.

Figure 6D:
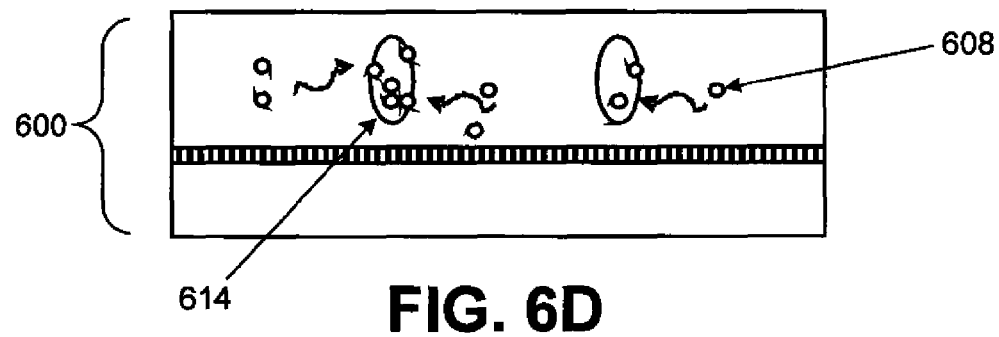

Masking layer 610 is then removed, as shown in FIG. 6D. After masking layer 610 is removed, substrate layer 600 is heated to drive impurities 608 to gettering sites 614.

Figure 6E:
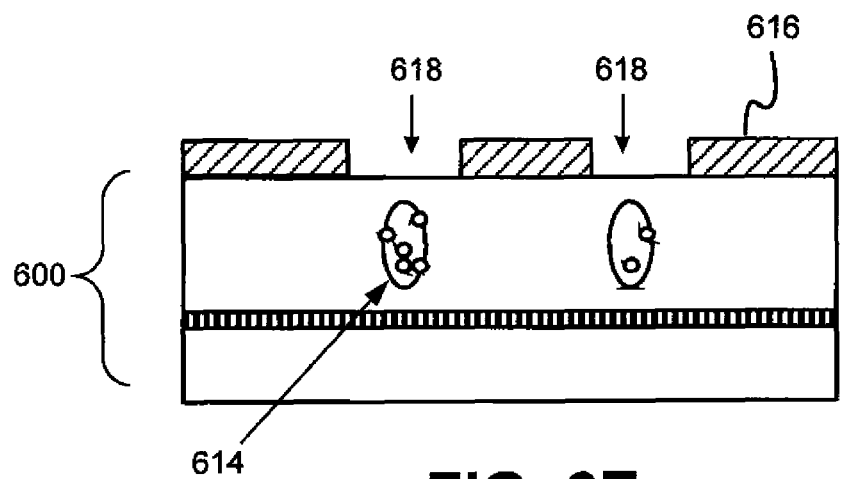

Next, as shown in FIG. 6E, masking layer 616 is deposited over substrate layer 600 and patterned to define openings 618. The areas of epitaxial layer 606 that are exposed in openings 618 correspond to areas where trench isolation regions will be formed at a later point in the processing of substrate layer 600. The size of openings 618 can be the same size or larger from openings 612 shown in FIG. 6B.

Figure 6F:
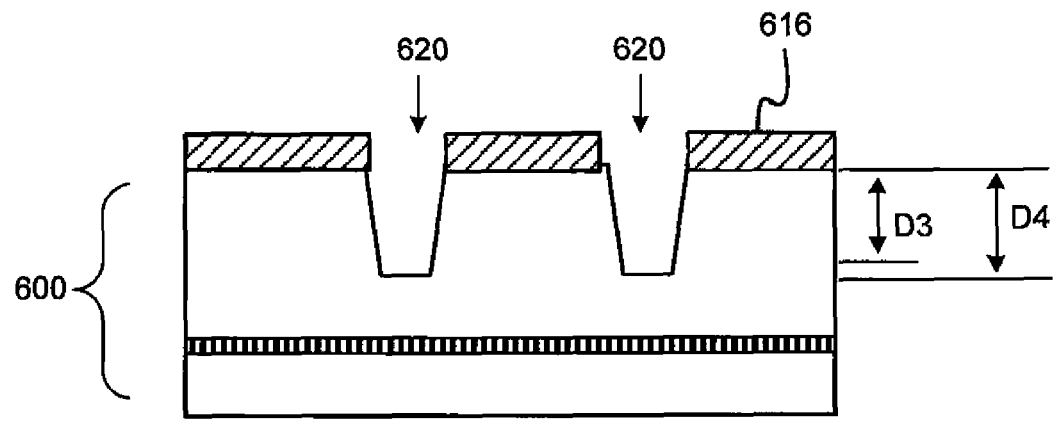

Substrate layer 600 (i.e., epitaxial layer 606) is then etched to produce trenches 620, as shown in FIG. 6F. Trenches 620 are etched to a depth D4 in substrate layer 600. Since gettering sites 614 were disposed at a shallower depth D3 compared to depth D4, gettering sites 614 and the gettered impurities are removed during the etching process. Masking layer 616 is removed and trenches 620 filled with an insulating material (not shown) to produce trench isolation regions.

Figure 7A:
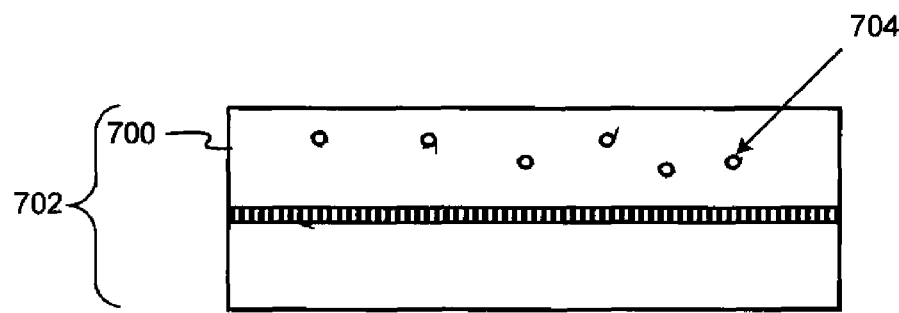
FIGS. 7A-7C are cross-sectional views of a substrate layer that are used to illustrate a third method of forming gettering sites and gettering impurities in an embodiment in accordance with the invention.
Figure 7B:
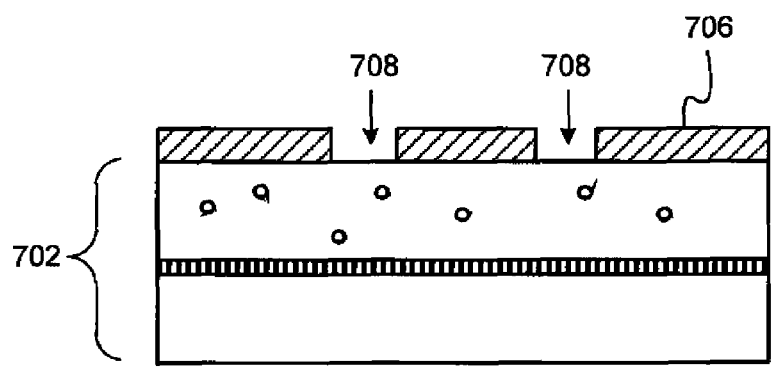
Figure 7C:
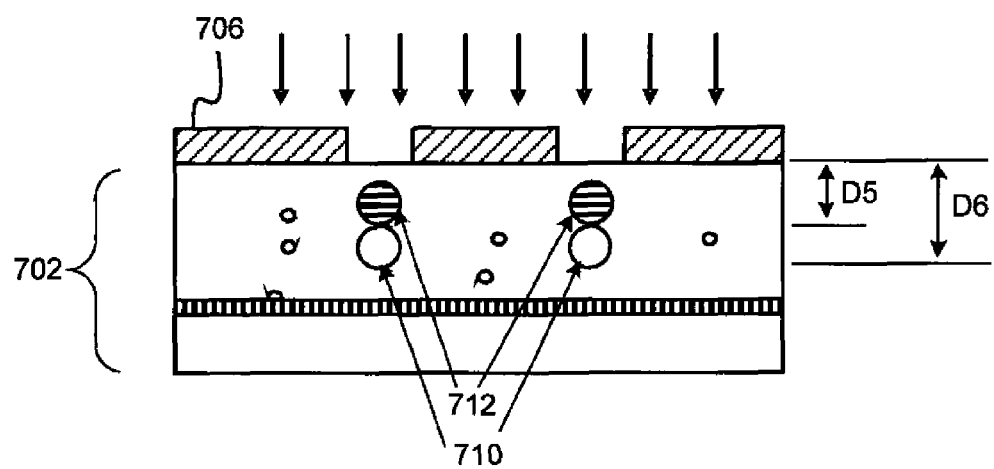

Referring now to FIGS. 7A-7C, there are shown cross-sectional views of a substrate layer that are used to illustrate a third method of forming gettering sites and gettering impurities in an embodiment in accordance with the invention. The illustrated embodiment depicts an SOI wafer, but other embodiments in accordance with the invention can use any type of substrate layer. Epitaxial layer 700 in substrate layer 702 includes impurities 704, including metallic impurities, as shown in FIG. 7A. Masking layer 706 is deposited over substrate layer 702 and patterned to define openings 708 (FIG. 7B). The areas of substrate layer 702 that are exposed in openings 708 correspond to areas where trench isolation regions will be formed at a later point in the processing of the substrate layer.

Next, as shown in FIG. 7C, ions are implanted into substrate layer 702 to form gettering sites 710 in epitaxial layer 700. Ions are also implanted into substrate layer 702 to form gettering sites 712 in epitaxial layer 700. Gettering sites 710 are disposed at a deeper depth (D6) in epitaxial layer 700 than gettering sites 710 at depth D5. Gettering sites 710 and gettering sites 712 are formed at a depth that will be removed during formation of the trench isolation regions in an embodiment in accordance with the invention. Processing of the substrate layer 702 continues with the techniques illustrated in FIGS. 6D-6F to produce the trench isolation regions. The process depicted in FIG. 6F removes both gettering sites 710 and 712 when the trenches are etched into epitaxial layer 700.

The species of ions implanted into substrate layer 702 that form gettering sites 710 can be different from the species of ions used to produce gettering sites 712 in an embodiment in accordance with the invention. Gettering sites 710, 712 can more easily getter different types of impurities. The same masking layer 706 can be used for the multiple ion implantations in an embodiment in accordance with the invention. In other embodiments in accordance with the invention, masking layer 706 can be used when ions are implanted for gettering sites 710 and a different masking layer used when ions are implanted for gettering sites 712.

Figure 8:
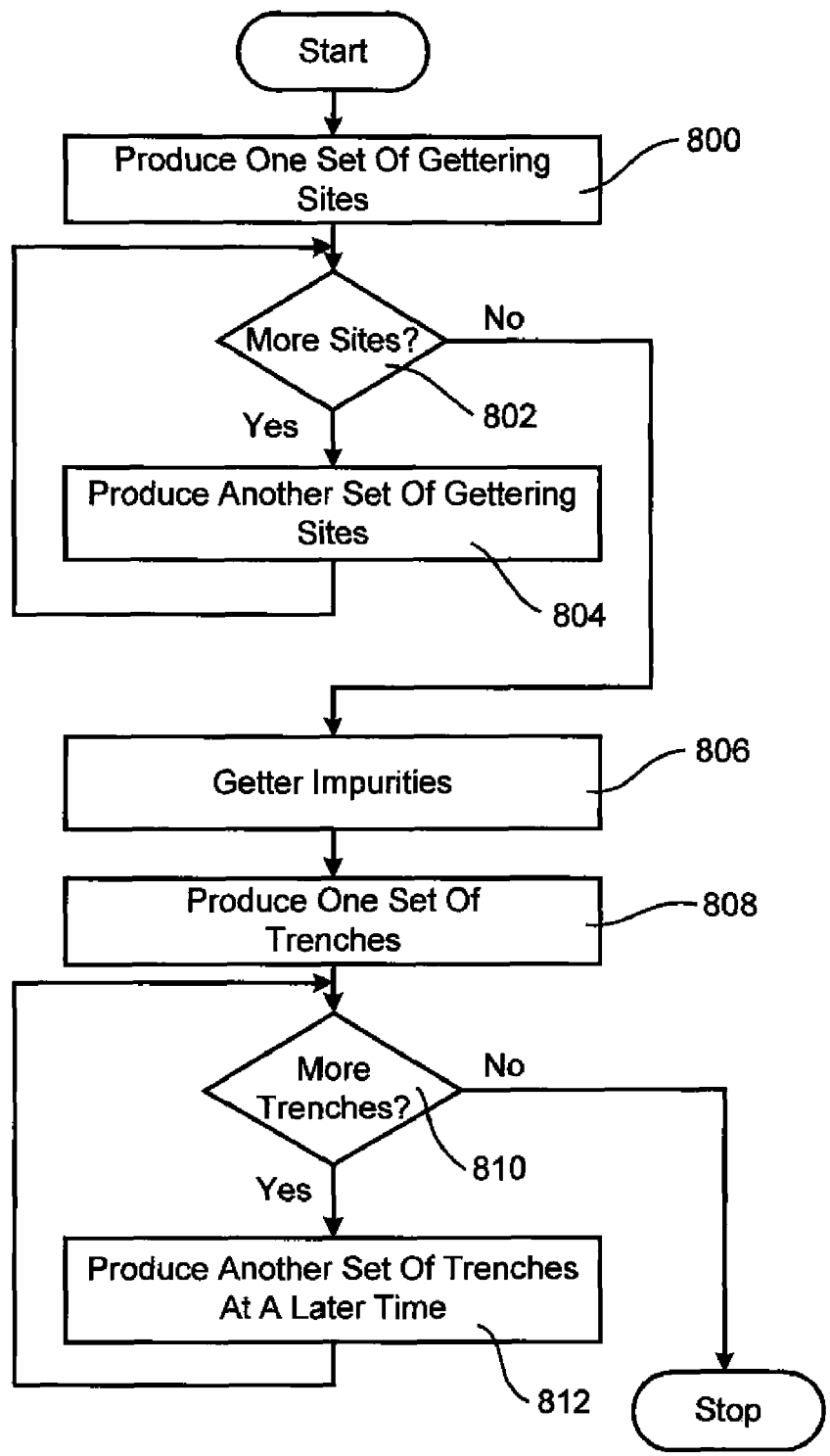
FIG. 8 is a flowchart of a fourth method of forming gettering sites and gettering impurities in an embodiment in accordance with the invention.

FIG. 8 is a flowchart of a fourth method of forming gettering sites and gettering impurities in an embodiment in accordance with the invention. Initially, one set of gettering sites are produced in a substrate layer, as shown in block 800. The set of gettering sites can be formed using the techniques illustrated in FIG. 5C, 6C, or 7C in an embodiment in accordance with the invention.

A determination is then made at block 802 as to whether or not another set of gettering sites is to be produced. If so, the process passes to block 804 where another set of gettering sites are formed. Each gettering site can be produced at a different location in a substrate layer from the gettering sites formed at block 800. Alternatively, each new gettering site can be produced above, below, or adjacent an existing gettering site formed at block 800. The new gettering sites can be produced using the same or different ions from the previously formed gettering sites. The method then returns to block 802.

When another set of gettering sites is not to be produced, the process passes to block 806 where a thermal process is performed to drive the impurities to the gettering sites. One set of trenches are then produced in the substrate layer at least some of the locations where gettering sites have been formed to remove the gettering sites and gettered impurities (block 808).

A determination is then made at block 810 as to whether or not additional trenches are to be formed in the substrate layer. If additional trenches are to be produced, the method passes to block 812 where another set of trenches are formed in the substrate layer. The additional set of trenches is formed some time after the set of trenches were produced at block 808 in an embodiment in accordance with the invention. This allows the gettering sites not removed at block 808 to continue to getter impurities during subsequent thermal treatments. The process returns to block 810 until all of the trenches have been formed in the substrate layer.

Examples of ions that can be implanted into a substrate layer to produce gettering sites at block 800 and at block 804 include, but are not limited to, oxygen, silicon, carbon, germanium, boron and phosphorus. Gettering sites can also be produced using radiation with elementary particles in an embodiment in accordance with the invention.

One advantage of the present invention is that it can use proximity gettering to getter impurities, including slow diffusing impurities. Proximity gettering typically does not require long thermal drives at high temperatures. So the gettering process can be performed at lower temperatures and/or for a less amount of time. Additionally, trench isolation regions are usually produced at the beginning of, or early in, the fabrication process. The present invention can therefore be used without substantially impacting the number of steps used in the fabrication process or the flow of the fabrication process.

The present invention can be used with any type of substrate layer, including substrate layers configured as SOI wafers. The buried oxide layer does not act as a diffusion barrier with the present invention. And as discussed earlier, the present invention can be used to form gettering sites and getter impurities in any device that includes a semiconductor substrate or wafer having trench regions. The present invention can be utilized at any location in a semiconductor substrate and for any type of trench. Examples of trenches include, but are not limited to, trench isolation regions, alignment marks, and FIN gates.

The invention has been described in detail with particular reference to certain preferred embodiments thereof, but it will be understood that variations and modifications can be effected within the spirit and scope of the invention. And even though specific embodiments of the invention have been described herein, it should be noted that the application is not limited to these embodiments. In particular, any features described with respect to one embodiment may also be used in other embodiments, where compatible. The features of the different embodiments may be exchanged, where compatible.

PARTS LIST

| | |
|---|---|
| 100 | image sensor |
| 102 | pixel |
| 104 | pixel array |
| 106 | column decoder |
| 108 | row decoder |
| 110 | digital logic |
| 112 | readout output circuits |
| 114 | region |
| 200 | photodetector |
| 202 | transfer gate |
| 204 | charge-to-voltage conversion region |
| 206 | substrate layer where trench isolation regions are disposed |
| 300 | trench isolation |
| 302 | trench |
| 304 | insulating material |
| 500 | substrate layer |
| 502 | impurity |
| 504 | masking layer |
| 506 | openings |
| 508 | gettering site |
| 510 | masking layer |
| 512 | openings |
| 514 | trenches |
| 600 | substrate layer |
| 602 | semiconductor substrate layer |
| 604 | insulating layer |
| 606 | epitaxial layer |
| 608 | impurity |
| 610 | masking layer |
| 612 | openings |
| 614 | gettering sites |
| 616 | masking layer |
| 618 | openings |
| 620 | trenches |
| 700 | epitaxial layer |
| 702 | substrate layer |
| 704 | impurities |
| 706 | masking layer |
| 708 | openings |
| 710 | gettering sites |
| 712 | gettering sites |

What is claimed is:

1. A method for processing a substrate layer, comprising:
    forming gettering sites in the substrate layer at locations where trench regions will be formed at a later time and at a depth that will be removed during the formation of the trench regions;
    driving impurities to the gettering sites; and
    etching the substrate layer to form the trench regions at locations corresponding to at least a portion of the gettering sites, wherein the gettering sites and gettered impurities at the etched locations are removed during the etching of the trench regions.

2. The method as in claim 1, further comprising prior to forming the gettering sites, forming a first masking layer over the substrate layer and patterning the masking layer to define openings where trench regions will be formed at a later time.

3. The method as in claim 2, further comprising removing the first masking layer.

4. The method as in claim 3, further comprising prior to etching the substrate layer to form the trench regions, forming a second masking layer over the substrate layer and patterning the second masking layer to define openings where trench regions will be formed.

5. The method as in claim 1, wherein the trench regions comprise trench isolation regions.

6. The method as in claim 1, wherein forming gettering sites in the substrate layer comprises:
    implanting one ion into the substrate layer to form gettering sites at one depth in the substrate layer; and
    implanting a different ion into the substrate layer to form gettering sites at another depth in the substrate layer.

7. The method as in claim 4, further comprising:
    prior to driving impurities to the gettering sites, forming a third masking layer over the substrate layer and patterning the third masking layer to define openings where trench regions will be formed at a later time;
    implanting different ions into the substrate layer to form gettering sites in the substrate layer at a depth that will be removed during formation of the trench regions; and
    removing the third masking layer.

8. The method as in claim 1, wherein etching the substrate layer to form the trench regions comprises etching the substrate layer to form one set of trench regions at locations corresponding to locations of only a portion of the gettering sites.

9. The method as in claim 8, further comprising at a later time etching the substrate layer to form another set of trench regions corresponding to locations of the remaining gettering sites.

10. A method for processing a substrate layer, comprising:
    (a) forming a first masking layer over the substrate layer and patterning the masking layer to define openings where trench regions will be formed at a later time;
    (b) forming gettering sites in the substrate layer at a depth that will be removed during formation of the trench regions;
    (c) removing the first masking layer;
    (d) driving impurities to the gettering sites;
    (e) forming a second masking layer over the substrate layer and patterning the second masking layer to define openings where trench regions will be formed; and
    (f) etching the substrate layer to form the trench regions at locations corresponding to at least a portion of the gettering sites, wherein the gettering sites and the gettered impurities at the etched locations are removed during the etching of the trench regions.

11. The method as in claim 10, wherein the trench regions comprise trench isolation regions.

12. The method as in claim 10, wherein (b) comprises:
    implanting one ion into the substrate layer to form gettering sites at one depth in the substrate layer; and
    implanting a different ion into the substrate layer to form gettering sites at another depth in the substrate layer.

13. The method as in claim 10, further comprising:
    prior to driving impurities to the gettering sites at (d), forming a third masking layer over the substrate layer and patterning the third masking layer to define openings where trench regions will be formed at a later time;

implanting different ions into the substrate layer to form gettering sites in the substrate layer at a depth that will be removed during formation of the trench regions; and removing the third masking layer.

14. The method as in claim 10, wherein (f) comprises etching the substrate layer to form one set of trench regions at locations corresponding to locations of only a portion of the gettering sites.

15. The method as in claim 14, further comprising at a later time etching the substrate layer to form another set of trench regions corresponding to locations of the remaining gettering sites.

16. The method as in claim 10, further comprising repeating (a)-(f) at a later time during the processing of the substrate layer.

17. The method as in claim 1, wherein forming gettering sites in the substrate layer at locations where trench regions will be formed at a later time and at a depth that will be removed during the formation of the trench regions comprises implanting ions into the substrate layer to form gettering sites in the substrate layer at locations where trench regions will be formed at a later time and at a depth that will be removed during the formation of the trench regions.

18. The method as in claim 10, wherein (b) comprises implanting ions into the substrate layer to form gettering sites in the substrate layer at locations where trench regions will be formed at a later time.

\* \* \* \* \*